United States Patent
Babcock et al.

(10) Patent No.: US 7,719,048 B1
(45) Date of Patent: May 18, 2010

(54) HEATING ELEMENT FOR ENHANCED E²PROM

(75) Inventors: Jeff A. Babcock, Sunnyvale, CA (US); Yuri Mirgorodski, Sunnyvale, CA (US); Natalia Lavrovskaya, Sunnyvale, CA (US); Saurabh Desai, Fremont, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 11/796,050

(22) Filed: Apr. 26, 2007

(51) Int. Cl.
*H01L 21/336* (2006.01)

(52) U.S. Cl. .................. 257/316; 257/E27.103

(58) Field of Classification Search .................. 257/316, 257/318, 319, 321, 322, 326, E21.68, E21.681, 257/E21.692, E23.101, E23.08, E23.081, 257/E31.131, E33.075, 314, 315, E21.666, 257/E27.103; 438/211, 258
See application file for complete search history.

(56) References Cited

U.S. PATENT DOCUMENTS

| | | | |
|---|---|---|---|
| 4,698,787 A | 10/1987 | Mukherjee et al. | 365/185 |
| 6,009,033 A * | 12/1999 | Li et al. | 365/212 |
| 6,137,723 A | 10/2000 | Bergemont et al. | 365/185.18 |
| 6,329,690 B1 * | 12/2001 | Morrett et al. | 257/350 |
| 6,992,927 B1 | 1/2006 | Poplevine et al. | 365/185.05 |
| 7,397,080 B2 * | 7/2008 | Wong et al. | 257/320 |
| 2004/0238873 A1 * | 12/2004 | Koo et al. | 257/314 |
| 2005/0224858 A1 * | 10/2005 | Hung et al. | 257/314 |

* cited by examiner

*Primary Examiner*—David Vu
*Assistant Examiner*—Suberr Chi
(74) *Attorney, Agent, or Firm*—Dergosits & Noah LLP

(57) ABSTRACT

A heating element is utilized to improve the bias conditions of an E²PROM cell during program and erase operations. The heating element can also be used to anneal or condition the cell for improved charge storage. During a program or an erase operation, the cell's control gate and read transistor are set to ground. The heating element then has a voltage potential applied across its terminals, causing current to flow in this resistor. As the current density increases, the resistor begins to generate heat. This heat is thermally coupled into the cell's floating gate, causing its temperature to rise.

5 Claims, 4 Drawing Sheets

HEATING ELEMENT FOR ENHANCED E²PROM

FIELD OF THE INVENTION

The present invention relates to electrically erasable programmable read only memory (E²PROM) devices and, in particular, to an E²PROM cell structure that utilizes a heating element to improve the bias conditions of the cell during program and erase operations. The heating element can also be used to anneal or condition the cell for improved charge storage.

DISCUSSION OF THE RELATED ART

U.S. Pat. No. 4,698,787, issued to Mukherjee et al. on Oct. 6, 1987 and titled "Single Transistor Electrically Programmable Memory Device and Method" discloses a well-known stacked gate nonvolatile memory (NVM) cell design. Modifications to the Mukherjee et al. NVM cell design are disclosed in U.S. Pat. No. 6,137,723, issued to Bergemont et al. on Oct. 24, 2000, and titled "Memory Device Having Erasable Frohmann-Bentchkowsky EPROM Cells That Use a Well-to-Floating Gate Coupled Voltage During Erasure" and in U.S. Pat. No. 6,992,927, issued to Poplevine et al. on Jan. 31, 2006, and titled "Nonvolatile Memory Cell."

The classic prior art NVM cell utilizes an isolated polysilicon floating gate for charge storage and includes two principal elements: a transistor and a capacitor. In the NVM cell design disclosed in the above-cited '787 patent, a second layer of polysilicon is used to create the cell's capacitor. In an alternate design disclosed in the '723 patent, a well-to-floating gate capacitor is utilized. Both of these designs utilize the cell's transistor in the programming and reading modes; erasing is performed either through the transistor or through the capacitor. Also, coupling to the capacitor is used to optimize operating voltages. The '927 patent discloses a 4-transistor NVM cell that utilizes a designated transistor for each function and, therefore, does not require high voltage switches.

SUMMARY OF THE INVENTION

A conductive heating element is provided in an E²PROM cell structure to improve the bias conditions of the cell. During a program or erase operation, the cell's control gate and read transistor are set to ground. Current is then caused to flow through the heating element, causing this resistor to generate heat. The heat is thermally coupled to the cell's floating gate.

Use of a heating element improves the programming charge distribution of the charge storage element measure in the final programmed state. Utilization of program and erase voltages in conjunction with high temperatures induced by the heating element allows better control of the tunneling charge injection and charge erase operations.

The heating element can also be used to anneal or condition the E²PROM cell for improved charge storage. This effect may become more important for low thermal budget processes in which it would be desirable to anneal the charge storage element at higher temperatures that can be achieved through thermal coupling to the heating element.

Additionally, the heating element can be used to improve charge trimming in an E²PROM, which is typically used to tighten the programmed Vt shift distribution between programmed states and erased states.

The features and advantages of the present invention will be more fully understood and appreciated upon consideration of the following detailed description of the invention and the accompanying set of drawings, which set forth illustrative embodiments in which the principles of the invention are utilized.

DETAILED DESCRIPTION OF THE INVENTION

The present invention provides an E²PROM cell structure that utilizes a heating element to reduce the electric field required to program or erase the cell. As discussed in greater detail below, the heating element can de used as a stand alone heating structure or it can be used as both a heating element and a charge programming element for the E²PROM cell.

Figure 1A:
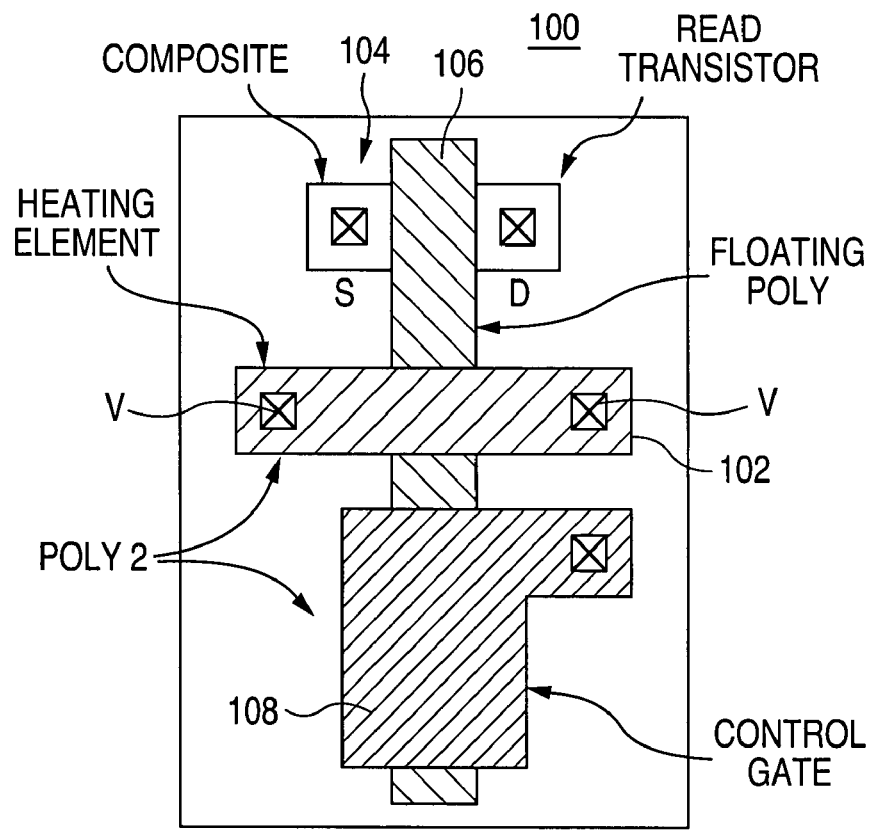
FIG. 1A is a layout drawing illustrating an embodiment of an E²PROM cell structure that includes a conductive heating element in accordance with the present invention.
Figure 1B:
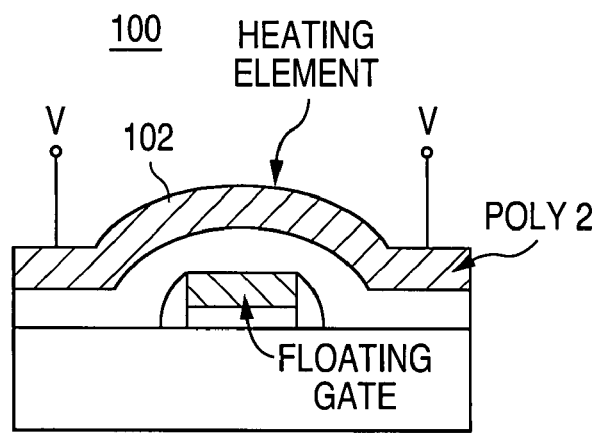
FIG. 1B is a cross-section drawing illustrating the FIG. 1A E²PROM cell structure.

FIGS. 1A and 1B show an embodiment of an E²PROM cell structure 100 that includes a polysilicon heating 102 that is simultaneously used for the program operation and for the erase operation of the cell 100. FIGS. 1A and 1B show a standard E²PROM cell having a read transistor 104 that uses composite source (S) and drain (D) contacts and a polysilicon floating gate 106 that is also used as the charge storage element of the cell that crosses under the polysilicon heating element 102. The polysilicon floating gate 106 also extends under a control gate 108 that can be fabricated from either a second layer of polysilicon (poly 2) or from composite. FIGS. 1A and 1B show both the heating element 102 and the control gate 108 fabricated from poly 2.

Figure 2A:
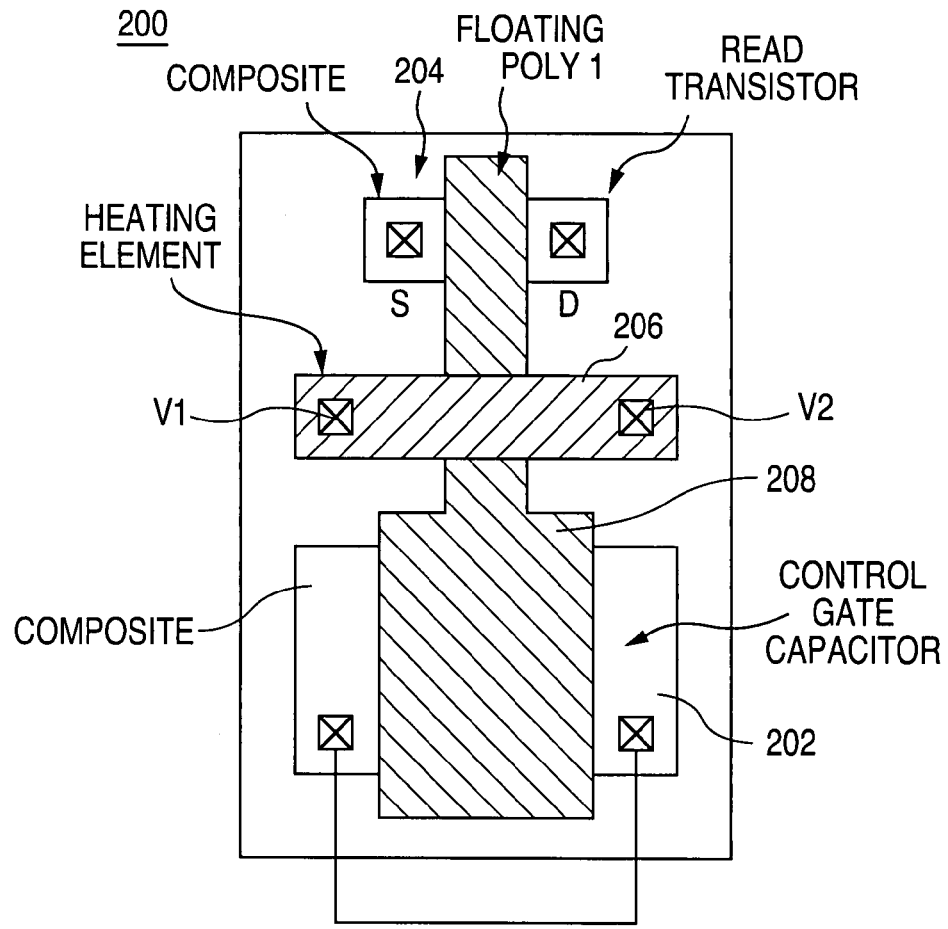
FIG. 2A is a layout drawing illustrating an alternate embodiment of an E²PROM cell structure that includes a conductive heating element in accordance with the present invention.
Figure 2B:
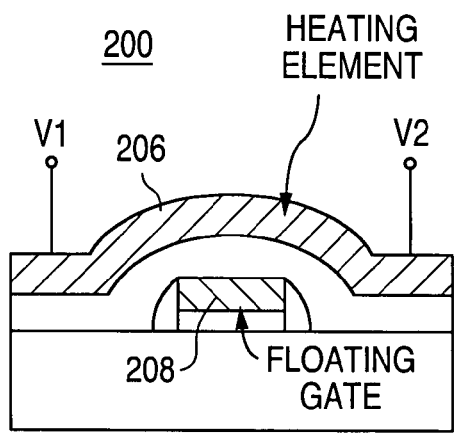
FIG. 2B is a cross-section drawing illustrating the FIG. 2A E²PROM cell structure.
Figure 3:
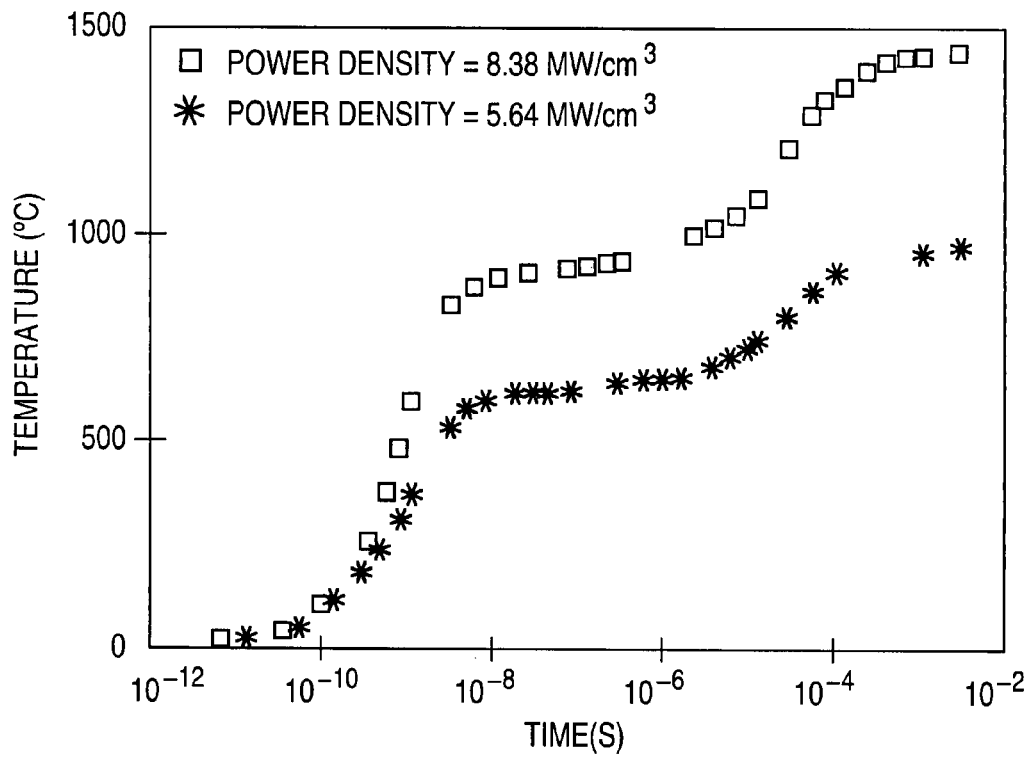
FIG. 3 is plot showing heat generated in a polysilicon resistor versus time for two different current densities flowing through the resistor.

FIGS. 2A and 2B show an alternate embodiment of the invention in which the composite is used for the control gate electrode 202. To program or erase the FIG. 2A/2B structure 200, the control gate 202 and the read transistor 204 are set to the ground state. The polysilicon heating element 206 then has a voltage potential applied across the terminals with voltage V1 and voltage V2 causing a current to flow through this poly resistor. As the current density is increased, the poly resistor begins to generate heat. Typical current density versus heat generated is shown in the FIG. 3 plot. As can be seen from FIG. 3, high temperatures are reached in the poly resistor within milli-seconds to tens of milli-seconds of time. This heat is thermally coupled into the floating gate 208 causing a temperature rise. It is possible to improve the thermal heat coupling to the floating gate 208 by etching the silicon from underneath the poly heating element 206 and the floating gate 208. By having a region etched away below the heating element, thermal resistance is increased, thereby allowing more heat to be coupled into the charge storage element. That is, improved heating efficiency is obtained and, thus, the power consumption needed for heating is improved. More uniform heating in the charge storage element may also result.

After thermal equilibrium is established, voltage V1 and voltage V2 can be increased to the programming voltage of the cell. That is, terminal 1 of the heating element 206 equals V1+VP and terminal 2 of the heating element 206 equals V2+VP, where ΔV=V2−V1 is the heat sustaining potential difference required to keep the heating element 206 hot during programming.

After programming, the heating element 206 can be used to anneal and/or condition the floating gate 208. This can be done by reducing ΔV=V2−V1 to a lower value that provides the corresponding lower temperature. Those skilled in the art will appreciate that ΔV can be optimized to achieve the best results. Use of the programming voltage in the positive direction allows a positive state to be programmed onto the floating gate 208, while the use of negative voltages can be used to erase the floating gate 208.

Figure 4:
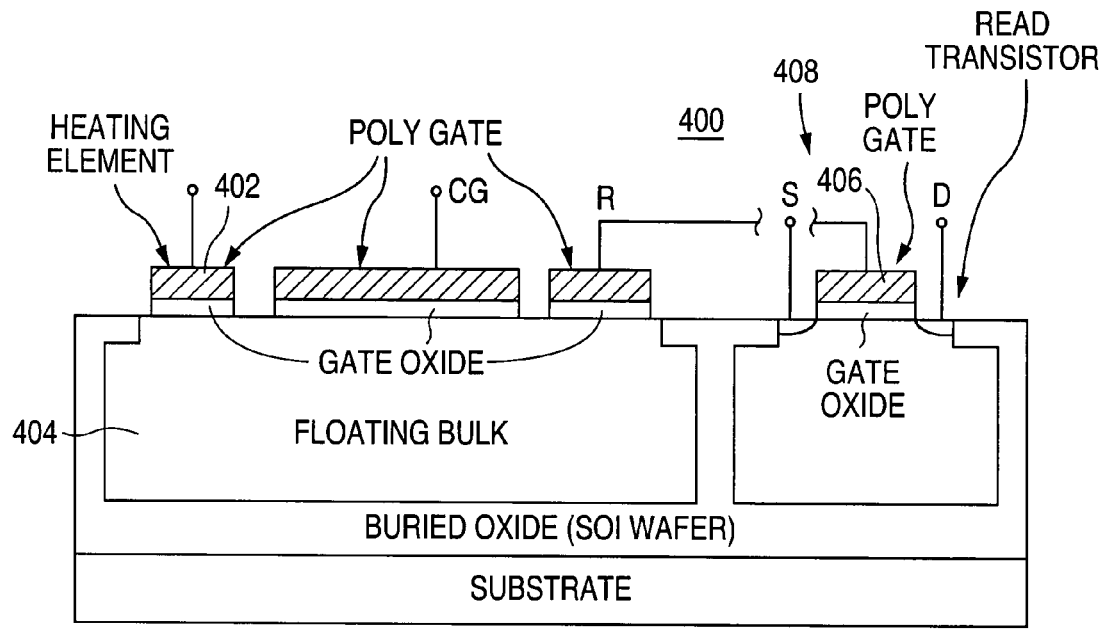
FIG. 4 is a cross-section drawing illustrating another alternate embodiment of an E²PROM cell structure that includes a conductive heating element in accordance with the present invention.
Figure 5:
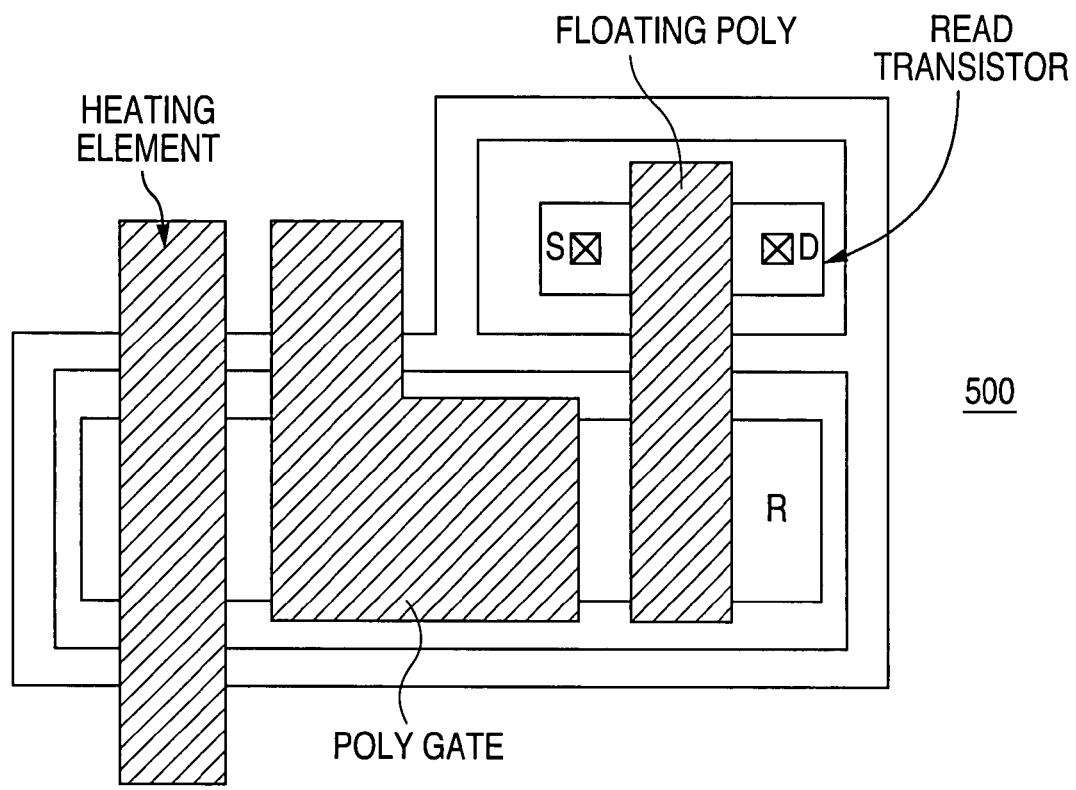
FIG. 5 is a layout drawing illustrating yet another alternate embodiment of an E²PROM cell structure that includes a conductive heating element in accordance with the present invention.

FIGS. 4 and 5 show additional alternate embodiments of an E$^2$PROM cell in accordance with the present invention. In the FIG. 4 structure 400, the polysilicon heating element 402 is placed over a floating composite region 404 that is capacitively coupled to the floating gate 406. This approach can be used on silicon-on-insulator (SOI) structures, such as that shown in FIG. 4, where it is desirable to separate the read transistor 408 from the programming and charge storage elements. FIG. 5 shows an alternate architecture 500 for isolated placement of the read transistor.

Figure 6:
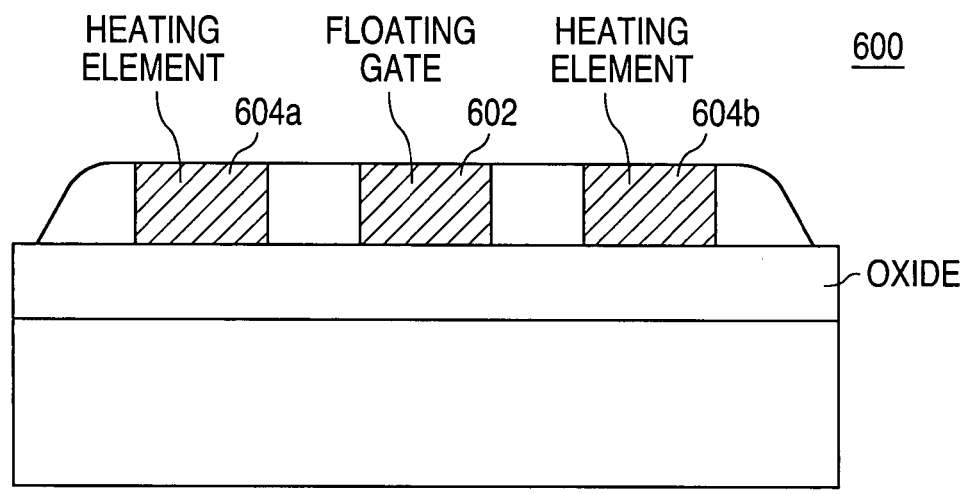
FIG. 6 is a cross-section drawing illustrating yet another alternate embodiment of an E²PROM cell structure that includes a conductive heating element in accordance with the present invention.

As yet another variant structure 600 in accordance with the concepts of the invention, the floating gate 602 is placed between two heating elements 604a, 604b, as shown in FIG. 6. This approach is desirable for a single poly process that is using SOI or bulk silicon as a starting material.

In the operation of each of the above-disclosed embodiments of the present invention, heating element enhanced Fowler-Nordheim tunneling is used for both program and erase operations. For a read operation, a read voltage, typically 1-3V, is applied to the drain of the read transistor and the drain current is measured. The current depends upon the R poly voltage which, in turn, depends upon FB voltage; it is either the same (R poly connected) or depends upon coupling ratios (R poly floating).

The primary advantages of an E$^2$PROM in accordance with the invention are to allow lower voltages to be used for programming and to improve consistency in the program and erase states of the E$^2$PROM cell. Less variance is expected at high temperatures during programming, allowing more consistent placement of charge on the floating gate.

Although each of the embodiments of the invention disclosed above utilizes heavily doped polysilicon, which is typically found in all standard CMOS process flows, as the material for the heating element, those skilled in the art will appreciate that the scope of the invention extends to the use of other materials, e.g., thin film resistors, that can be used to generate heat. A primary object of the invention is to thermally couple heat from a heating element into the floating gate or programming node of an E$^2$PROM cell structure to improve E$^2$PROM circuit operation.

It should be understood that the particular embodiments of the invention described above have been provided by way of example and that other modifications may occur to those skilled in the art without departing from the scope and spirit of the invention as express in the appended claims and their equivalents.

What is claimed is:

1. An E$^2$PROM cell structure comprising:
 a read transistor that includes spaced apart source and drain diffusion regions formed in a semiconductor substrate and that define a substrate channel region therebetween;
 a conductive charge storage element that includes a first portion that is formed over the substrate channel region of the read transistor and is separated therefrom by a first layer of intervening dielectric material and a second portion that extends away from the substrate channel region of the read transistor and is separated from the semiconductor substrate by the first layer of intervening dielectric material;
 a conductive control gate that is formed over the conductive storage element and is separated from the conductive charge storage element by a second layer of intervening dielectric material; and
 a conductive heating element that is formed over the second portion of the conductive charge storage element and separated therefrom by the second layer of intervening dielectric material such that the conductive heating element is placed between and spaced apart from the conductive control gate and the read transistor from a plan view, the conductive heating element being disposed to provide heat to the conductive charge storage element.

2. An E$^2$PROM cell structure comprising:
 a read transistor that includes spaced apart source and drain diffusion regions formed in a semiconductor substrate and that define a substrate channel region therebetween;
 a polysilicon floating gate electrode having a first portion that extends over the substrate channel region of the read transistor and is separated therefrom by a first layer of intervening dielectric material;
 a polysilicon control gate electrode formed over a second portion of the floating gate electrode and separated therefrom by a second layer of intervening dielectric material; and
 a conductive heating element formed over and separated from a third portion of the floating gate electrode by the second layer of intervening dielectric material such that the conductive heating element is placed between and spaced apart from the polysilicon control gate electrode and the read transistor from a plan view, to provide heat to the floating gate electrode.

3. The E$^2$PROM cell structure as in claim 2, and wherein the conductive heating element comprises polysilicon.

4. An E$^2$PROM cell structure as in claim 2, and wherein the conductive heating element is separated from the floating gate electrode by a second layer of intervening dielectric material.

5. An E$^2$PROM cell structure as in claim 2, and wherein the conductive heating element is adapted for connection to a power supply such that, when the power supply causes current to flow through the heating element during operation of the E$^2$PROM structure, resistive heating of the conductive heating element provides heat to the floating gate electrode.

* * * * *